United States Patent [19]
Ehben

[11] Patent Number: 6,104,080
[45] Date of Patent: Aug. 15, 2000

[54] INTEGRATED CIRCUIT HAVING CAPACITORS FOR SMOOTHING A SUPPLY VOLTAGE

[75] Inventor: Thomas Ehben, München, Germany

[73] Assignee: Siemens Aktiengesellschaft, Munich, Germany

[21] Appl. No.: 09/137,913

[22] Filed: Aug. 20, 1998

[30] Foreign Application Priority Data

Aug. 20, 1997 [DE] Germany .................. 197 36 197

[51] Int. Cl.$^7$ .................. H01L 29/00; H01L 23/62; H01L 27/10
[52] U.S. Cl. .................. 257/532; 257/533; 257/535; 257/553; 257/554; 257/665; 257/207; 257/208; 257/211
[58] Field of Search .................. 257/532, 533, 257/535, 553, 554, 665, 207, 208, 211

[56] References Cited

U.S. PATENT DOCUMENTS

| | | | |
|---|---|---|---|
| 4,831,431 | 5/1989 | Hanlon | 357/51 |
| 5,606,197 | 2/1997 | Johansson et al. | |
| 5,656,834 | 8/1997 | Grzyb et al. | 257/207 |

FOREIGN PATENT DOCUMENTS

| | | |
|---|---|---|
| 2-250370 | 10/1990 | Japan . |
| 2250370 | 10/1990 | Japan . |
| 4127464 | 4/1992 | Japan . |

*Primary Examiner*—David Hardy
*Assistant Examiner*—Matthew E. Warren
*Attorney, Agent, or Firm*—Herbert L. Lerner; Laurence A. Greenberg; Werner H. Stemer

[57] ABSTRACT

The integrated circuit is provided with capacitors for smoothing the supply voltage. The capacitors are disposed below the supply interconnects which supply the integrated circuit with the supply voltage. This enables the integrated circuit to be accommodated on a minimal area.

14 Claims, 2 Drawing Sheets

INTEGRATED CIRCUIT HAVING CAPACITORS FOR SMOOTHING A SUPPLY VOLTAGE

BACKGROUND OF THE INVENTION

1. Field of the Invention

The invention pertains to an integrated circuit with capacitors for smoothing the supply voltage.

Integrated circuits are known in a multiplicity of embodiments and require no further explanation. Smoothing the supply voltage of integrated circuits by means of capacitors proves to be advantageous because it enables the integrated circuits to operate free from interference, and it means that they have reduced electromagnetic emission. Integrating the capacitors provided for smoothing into the integrated circuit makes particularly effective smoothing possible. On the other hand, capacitors provided in integrated circuits require a relatively large area on the chip containing the integrated circuit, and integrated circuits containing capacitors are therefore relatively large and hence also expensive, susceptible to faults and cumbersome.

2. Summary of the Invention

It is accordingly an object of the invention to provide an integrated circuit, which overcomes the above-mentioned disadvantages of the heretofore-known devices and methods of this general type and which can be accommodated on an area that is as small as possible.

With the foregoing and other objects in view there is provided, in accordance with the invention, an integrated circuit, comprising:

supply interconnects disposed on a substrate body for supplying the integrated circuit with a supply voltage; and a plurality of capacitors for smoothing the supply voltage carried on the supply interconnects, the capacitors being disposed below the supply interconnects.

In other words, the invention is characterized by the positioning of the capacitors below the supply interconnects which are used to supply the integrated circuit with the supply voltage.

As the regions below the supply interconnects in conventional integrated circuits have not been used at all to date, integrating the capacitors makes the integrated circuit no larger, or at the outside minimally larger, than it would be without the capacitor integration.

The integrated circuit according to the invention can therefore be accommodated on a minimal area.

The proximity of the capacitors to the supply interconnects carrying the supply voltage which is to be smoothed makes it possible, furthermore, for the electrical connections, which are necessary in order to arrange the capacitors such that they act between the two terminals of the supply voltage, to be extremely short. This, of course, means that the integrated circuit is simple in construction, easy to manufacture, and reliable in operation.

In accordance with an added feature of the invention, the supply interconnects comprise a VDD supply interconnect for a VDD potential, and a VSS supply interconnect for a VSS potential, whereby the supply interconnects form a constituent part of a metal layer of the integrated circuit.

In accordance with an additional feature of the invention, the plurality of capacitors are one or more capacitors below each the VDD supply interconnect and the VSS supply interconnect.

In accordance with another feature of the invention, the capacitors are either disposed essentially below the VDD supply interconnect or essentially below the VSS supply interconnect.

In accordance with a further feature of the invention, a polysilicon layer is disposed on the substrate body. The capacitors below the VDD supply interconnect are formed by interacting poly sections in the polysilicon layer and $p^+$-regions below the poly sections in the substrate body. The capacitors below the VSS supply interconnect are formed by interacting poly sections in the polysilicon layer and $n^+$-regions below the poly sections in the substrate body. The poly sections of the capacitors below the VDD supply interconnect are electrically connected to the VSS supply interconnect, and the $p^+$-regions are multiply connected to the VDD supply interconnect. The poly sections of the capacitors below the VSS supply interconnect are electrically connected to the VDD supply interconnect, and the $n^+$-regions are multiply connected to the VSS supply interconnect.

In accordance with again a further feature of the invention, the poly sections are strips with finger-like projections. The projections of the poly sections of the capacitors below the VDD supply interconnect extend to below the VSS supply interconnect, and the finger-like projections of the poly sections of the capacitors below the VSS supply interconnect extending to below the VDD supply interconnect.

In accordance with a concomitant feature of the invention, the intermediate spaces formed between mutually adjacent poly sections are used for connecting the $p^+$-regions to the VDD supply interconnect and for connecting the $n^+$-regions to the VSS supply interconnect.

Other features which are considered as characteristic for the invention are set forth in the appended claims.

Although the invention is illustrated and described herein as embodied in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
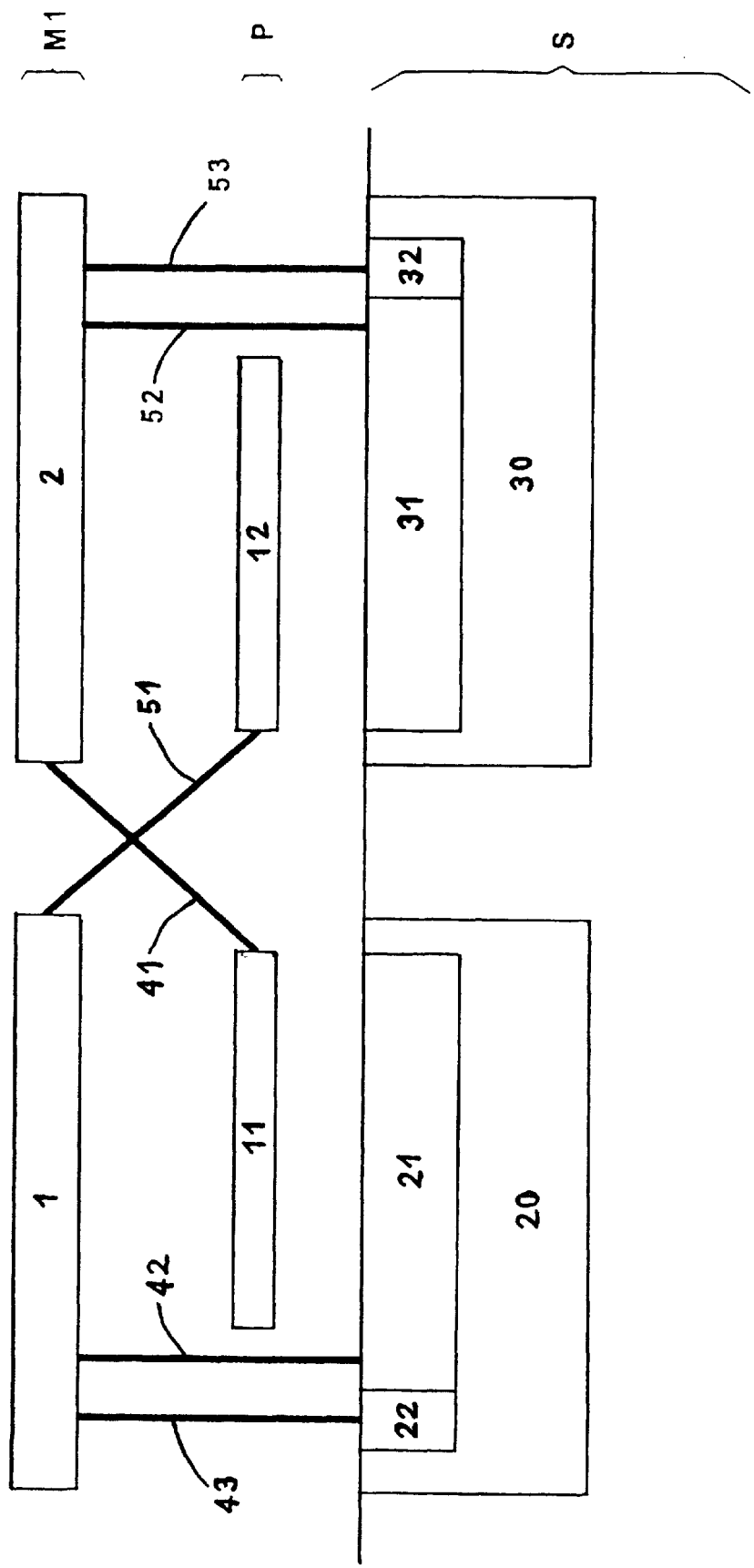
FIG. 1 is a schematic sectional view of the basic concept and preferred arrangement of capacitors for smoothing the supply voltage in an integrated circuit.

Referring now to the figures of the drawing in detail and first, particularly, to FIG. 1 thereof, it is pointed out that all sectional hatching has been omitted for reasons of clarity.

The integrated circuit of the best mode preferred embodiment is a CMOS circuit which comprises a substrate S (for example made of silicon), a polysilicon layer (poly layer) P arranged at a distance above the latter, and a metal layer M1 arranged at a distance above the poly layer P. Other layers may be provided as well, for example a poly2 layer, a metal2 layer, and the like. The intermediate spaces between the individual layers are filled in with an insulating material (for example silicon oxide) which is not indicated in more detail in the figures.

The illustrated structures of the metal layer M1 are a VDD supply interconnect 1 and a VSS supply interconnect 2 which are used to carry the supply voltage (the VDD potential and the VSS potential in the example) to those points at which it is needed. As the designations themselves indicate, the VDD potential is applied to the integrated circuit via the VDD supply interconnect 1, and the VSS potential is applied to the integrated circuit via the VSS supply interconnect 2.

The VDD supply interconnect 1 and the VSS supply interconnect 2 are connected to one another via capacitors for smoothing the supply voltage. As will be described in more detail below, the smoothing capacitors are arranged below the VDD supply interconnect 1 and/or the VSS supply interconnect 2 and are formed by the interaction of the polysilicon layer P and the substrate S.

As shown by the illustration in FIG. 1, two capacitors are provided. One capacitor is drawn below the VDD supply interconnect 1 and the other capacitor is drawn below the VSS supply interconnect 2.

The capacitor located below the VDD supply interconnect 1 is formed by a poly section 11 formed in the polysilicon layer, a $p^+$-region 21 provided below the poly section 11 in the substrate S or an n-well 20 in the latter, and the insulating material situated in between; the capacitor located below the VSS supply interconnect 2 is formed by a poly section 12 formed in the polysilicon layer, an $n^+$-region 31 provided below said poly section 12 in the substrate S or a p-well 30 in the latter, and the insulating material situated in between.

From the capacitor located below the VDD supply interconnect 1, the poly section 11 is connected to the VSS supply interconnect 2 via a plated-through hole 41, and the $p^+$-region 21 is connected to the VDD supply interconnect 1 via a plated-through hole 42. The capacitor located below the VDD supply interconnect is therefore disposed and connected so that it acts between the VDD supply interconnect 1 and the VSS supply interconnect 2.

From the capacitor located below the VSS supply interconnect 2, the poly section 12 is connected to the VDD supply interconnect 1 via a plated-through hole 51, and the $n^+$-region 31 is connected to the VSS supply interconnect 2 via a plated-through hole 52; the capacitor located below the VSS supply interconnect 2 is therefore likewise arranged so that it acts between the VDD supply interconnect 1 and the VSS supply interconnect 2, the capacitor located below the VDD supply interconnect 1 and the capacitor located below the VSS supply interconnect 2 thereby being arranged electrically in parallel with one another.

A multiplicity of plated-through holes 42 should be provided between the $p^+$-region 21 and the VDD supply interconnect 1, and a multiplicity of plated-through holes 52 should be provided between the $n^+$-region 31 and the VSS supply interconnect 2, particularly if the capacitors have a relatively large area. Consequently, the real parts of the capacitor impedances can be kept low, which is of great importance, particularly for the radio-frequency response of the capacitors. It proves to be particularly advantageous if the resistance of a respective capacitor is produced in approximately equal portions by the $p^+$-region 21 and the poly section 11 or by the $n^+$-region 31 and the poly section 12.

An $n^+$-region 22 connected to the VDD supply interconnect 1 via a plated-through hole 43 is provided adjacent to the $p^+$-region 21 and—if present—likewise also inside the n-well 20. Similarly, a $p^+$-region 32 connected to the VSS supply interconnect 2 via a plated-through hole 53 is provided adjacent to the $n^+$-region 31 and—if present—likewise also inside the p-well 30. The plated-through holes 43 and 53 are so-called substrate contacts whose function and manner of operation are known and require no further explanation. However, in the exemplary embodiment, the substrate contacts are provided "only" for reliability reasons as a precaution against circumstances which do not normally occur and/or for standardizing the manufacture of the wells. No changes, at any rate no serious changes, in the function and manner of operation of the respective capacitors need be expected if the substrate contacts are omitted, i.e. the $n^+$-region 22 and the plated-through hole 43 as well as the $p^+$-region 32 and the plated-through hole 53.

As mentioned above, the illustration of the structure and arrangement of the capacitors in FIG. 1 is highly schematic. One possible practical implementation of such a configuration will now be explained with reference to FIG. 2.

Figure 2:
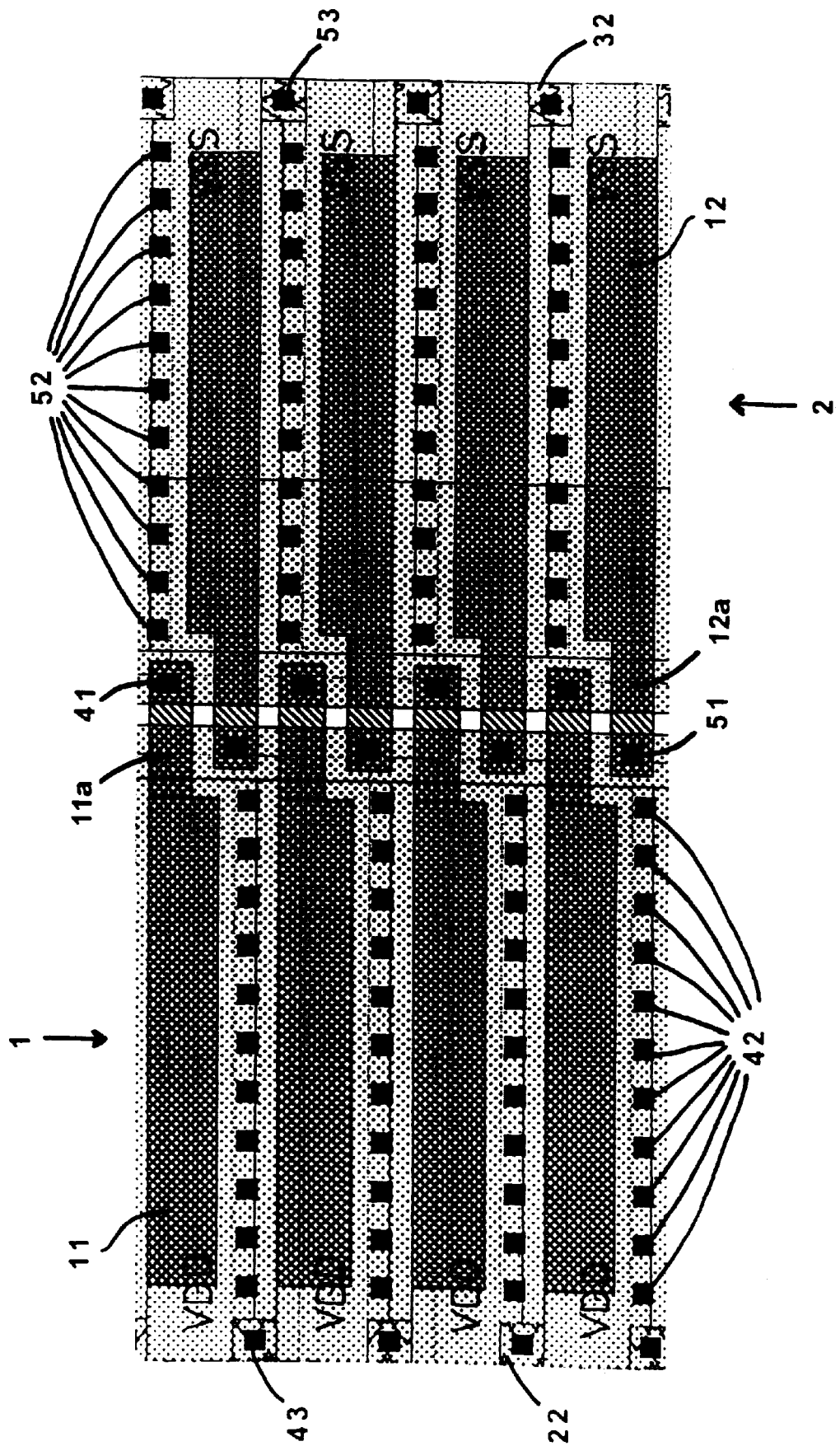
FIG. 2 is a plan view onto an integrated circuit containing capacitors as shown in FIG. 1.

Mutually corresponding elements in FIGS. 1 and 2 are identified with the same reference symbols.

The capacitors provided for smoothing the supply voltage (the "smoothing capacitors") are located essentially entirely below the supply interconnects 1 and 2. They are illustrated there as dotted areas.

The numerous poly sections 11 and 12 that are illustrated as dashed areas in FIG. 2 are of strip-like design. The number of poly sections 11 and 12 corresponds—at least in the exemplary embodiment—to the number of capacitors present.

The poly sections 11 are arranged essentially entirely below the VDD supply interconnect 1. However, each of the poly sections 11 has a finger-like projection 11a which extends, beyond the region of the VDD supply interconnect 1, below the VSS supply interconnect 2 and is connected to the latter at that point by means of the through-plated hole 41 illustrated as a black area. A similar situation applies to the poly sections 12: they are arranged essentially entirely below the VSS supply interconnect 2, but each of the poly sections 12 has a finger-like projection 12a which extends, beyond the region of the VSS supply interconnect 2, below the VDD supply interconnect 1 and is connected to the latter at this point by means of the through-plated hole 51.

In order that the finger-like projections 11a and 12a are able to pass by one another with a sufficient spacing, the poly sections 11 and 12 are arranged offset relative to one another in their transverse direction. The mutual offset may be dispensed with, particularly if the poly sections 11 and 12 are wider and/or the finger-like projections 11a and 12a are narrower than illustrated in FIG. 2.

The $p^+$-region 21 (not shown in FIG. 2) located below each poly section 11 is designed with a larger area than the relevant poly section 11 and is connected to the VDD supply interconnect 1 by means of a multiplicity of plated-through holes 42 arranged in a row. That row of plated-through holes is located in each case in the intermediate space between adjacent poly sections 11. It is not necessary for each poly section 11 to be assigned its own $p^+$-region 21. Instead, it is also possible to provide a single large $p^+$-region common to all poly sections 11.

The same applies to the capacitors provided below the VSS supply interconnect 2: the $n^+$-region 31 (not shown in FIG. 2) located below each poly section 12 is designed with a larger area than the relevant poly section 12 and is connected to the VSS supply interconnect 2 by means of a multiplicity of plated-through holes 52 arranged in a row. That row of plated-through holes is located in each case in the intermediate space between adjacent poly sections 12. It is not necessary for each poly section 12 to be assigned its own $n^+$-region 31. Instead, it is also possible to provide a single large $n^+$-region common to all poly sections 12.

Each capacitor has a substrate contact. This is the plated-through contact 43 in the case of the capacitors located below the VDD supply interconnect 1. In the case of the capacitors located below the VSS supply interconnect 1 it is the plated-through hole 53.

The arrangement of capacitors below the supply interconnects, which has not been practical in the past, proves to be advantageous in several respects: firstly because that space has not been used otherwise to date and the size of the integrated circuit is not increased by disposing the capacitors at that position, and secondly because the essential connections between the supply interconnects and the capacitors, wherever they may be provided, can thus be produced in a particularly simple and elegant manner.

Although the topography illustrated in FIG. 2 is currently considered the best mode embodiment with the simplest and most efficient capacitor configuration, it should not be understood as restricting the invention. In principle, the capacitors may be arranged in any desired manner below the supply interconnects.

In summary, it will be appreciated that the above-described integrated circuit can be accommodated very simply on a minimal area.

I claim:

1. An integrated circuit, comprising:

a substrate body;

supply interconnects disposed on substrate body for supplying the integrated circuit with a supply voltage;

a plurality of capacitors for smoothing the supply voltage carried on said supply interconnects, said capacitors being disposed below said supply interconnects; and a polysilicon layer disposed on said substrate body, said capacitors below said supply interconnects including interacting poly sections in said polysilicon layer, said poly sections being strips with finger-like projections formed thereon, a respective plurality of said poly sections being disposed under a respective one of said supply interconnects, said finger-like projections of said capacitors below one of said supply interconnects extending to a point below a respective other one of said supply interconnects.

2. The integrated circuit according to claim 1, which further comprises a metal layer disposed on said substrate body, and wherein said supply interconnects comprise a VDD supply interconnect for a VDD potential, and a VSS supply interconnect for a VSS potential, said supply interconnects forming a constituent part of said metal layer.

3. The integrated circuit according to claim 2, wherein said plurality of capacitors are one or more capacitors below each said VDD supply interconnect and said VSS supply interconnect.

4. The integrated circuit according to claim 2, wherein said capacitors are disposed essentially below said VDD supply interconnect.

5. The integrated circuit according to claim 4, wherein said capacitors below said VDD supply interconnect are formed by respective ones of said interacting poly sections in said polysilicon layer and $p^+$-regions below said respective ones of said poly sections in said substrate body.

6. The integrated circuit according to claim 5, wherein said poly sections are electrically connected to said VSS supply interconnect, and said $p^+$-regions are connected at several points to said VDD supply interconnect.

7. The integrated circuit according to claim 2, wherein said capacitors are disposed essentially below said VSS supply interconnect.

8. The integrated circuit according to claim 7, wherein said capacitors below said VSS supply interconnect are formed by respective ones of said interacting poly sections in said polysilicon layer and $n^+$-regions below said respective ones of said poly sections in said substrate body.

9. The integrated circuit according to claim 8, wherein said poly sections are electrically connected to said VDD supply interconnect, and said $n^+$-regions are connected at several points to said VSS supply interconnect.

10. The integrated circuit according to claim 2, wherein some of said capacitors are disposed essentially below said VDD supply interconnect and some of said capacitors are disposed essentially below said VSS supply interconnect.

11. The integrated circuit according to claim 10, wherein said capacitors below said VDD supply interconnect are formed by respective ones of said interacting poly sections in said polysilicon layer and $p^+$-regions below said respective ones of said poly sections in said substrate body, and said capacitors below said VSS supply interconnect are formed by respective other ones of said interacting poly sections in said polysilicon layer and $n^+$-regions below said respective other ones of said poly sections in said substrate body.

12. The integrated circuit according to claim 11, wherein said poly sections of said capacitors below said VDD supply interconnect are electrically connected to said VSS supply interconnect, said poly sections of said capacitors below said VSS supply interconnect are electrically connected to said VDD supply interconnect, said $p^+$-regions are multiply connected to said VDD supply interconnect, and said $n^+$-regions are multiply connected to said VSS supply interconnect.

13. The integrated circuit according to claim 11, wherein said finger-like projections of said capacitors below said VDD supply interconnect extend to a point below said VSS supply interconnect, said finger-like projections of said capacitors below said VSS supply interconnect extend to a point below said VDD supply interconnect.

14. The integrated circuit according to claim 11, wherein intermediate spaces between mutually adjacent poly sections are used for connecting said $p^+$-regions to said VDD supply interconnect and for connecting said $n^+$-regions to said VSS supply interconnect.

* * * * *